(12) United States Patent
Kato et al.

(10) Patent No.: US 7,342,364 B2
(45) Date of Patent: Mar. 11, 2008

(54) LIGHT SOURCE

(75) Inventors: Satoru Kato, Aichi (JP); Tetsu Kachi, Aichi (JP); Kazuyoshi Tomita, Aichi (JP); Hiroshi Ito, Aichi (JP); Masanori Kojima, Aichi (JP)

(73) Assignee: Toyoda Gosei Co., Ltd., Nishikasugai-gun, Aichi (JP)

( * ) Notice: Subject to any disclaimer, the term of this patent is extended or adjusted under 35 U.S.C. 154(b) by 34 days.

(21) Appl. No.: 11/226,373

(22) Filed: Sep. 15, 2005

(65) Prior Publication Data

US 2006/0061302 A1    Mar. 23, 2006

(30) Foreign Application Priority Data

Sep. 16, 2004    (JP)    ............................ P2004-269687

(51) Int. Cl.
*H05B 37/00*    (2006.01)
(52) U.S. Cl. ...................................... 315/291; 315/363
(58) Field of Classification Search ................ 315/291, 315/363; 327/478; 257/94, 96
See application file for complete search history.

(56) References Cited

U.S. PATENT DOCUMENTS

| 6,593,597 B2 * | 7/2003 | Sheu ........................... 257/94 |
| 2004/0095184 A1 * | 5/2004 | Oka et al. ................... 327/478 |

FOREIGN PATENT DOCUMENTS

| EP | 1 154 291 A1 | 11/2001 |
| JP | 11-038766 | 2/1999 |
| JP | 2003-163377 | 6/2003 |

\* cited by examiner

*Primary Examiner*—David H. Vu
(74) *Attorney, Agent, or Firm*—McGinn IP Law Group PLLC

(57) ABSTRACT

A light source comprising a light emitting diode comprising a GaN-based compound and having a single quantum well structure, and a driving voltage source for applying a pulse voltage to the light emitting diode, wherein a voltage at a low level of the pulse voltage is set to a voltage lower than a voltage at which a fall time of the light emitting diode is made the longest.

14 Claims, 3 Drawing Sheets

RESPONSE SPEED CHARACTERISTIC OF SQW

RESPONSE SPEED CHARACTERISTIC OF MQW

LIGHT SOURCE

This application is based on Japanese Patent Application No. 2004-269687, which is incorporated herein by reference.

BACKGROUND OF THE INVENTION

1. Field of the Invention

The present invention relates to a light source which blinks at high rates. Particularly, the invention relates to a light source which can blink at a rate high enough to be utilized for optical communication.

2. Description of the Related Art

There exist a large number of situations in which an optical communication system is desired to be built in a relatively short distance and to transmit a large amount of information. Investigations are now under progress for building an optical communication system in such situations using plastic optical fibers (hereinafter called the "POF") at a low cost.

In optical communication systems which utilize the POF or the like, an attempt has been made to utilize light emitting diodes made of group III-V compounds. For example, researches have been made for utilizing a green or a blue light emitting diode of a GaN (gallium nitride) based compound, or a red light emitting diode of an AlGaInP-based compound for a light source of an optical communication system which utilizes the POF. With the use of light emitting diodes of group III-V compounds, it is possible to produce light at wavelengths with small transmission losses of POF.

In an optical communication system, a light emitting diode is blinked by applying a pulse voltage to the light emitting diode. For increasing the transmission rate, it is important to reduce a fall time of the light emitting diode. The fall time, herein referred to, means a time until the light output of the light emitting diode is reduced when the pulse voltage applied to the light emitting diode is switched from a high level to a low level. Specifically, when the light output of the light emitting diode when applied with a voltage at high level is designated by P1, and the light output of the light emitting diode when applied with a voltage at low level is designated by P2, the fall time is a time required until the light output calculated by $P2+(P1-P2)\times0.9$ changes to the light output calculated by $P2+(P1-P2)\times0.1$. The blinking, herein referred to, means a reduction of the light output when the light emitting diode is applied with a voltage at low level below the light output when applied with a voltage at high level, and is not limited to a reduction of the light output to zero.

A technique for reducing the fall time of the light emitting diode is disclosed in JP-A-2003-163377. The technique of JP-A-2003-163377 utilizes a pulse voltage which presents a small difference between a voltage at low level and a voltage at high level, as shown in FIG. 5A. This example utilizes a pulse which has the voltage at high level set at 3.1 V, and the voltage at low level set at 2.8 V.

A solid line 42 shown in FIG. 5B indicates a change over time of a light output when the pulse voltage shown in FIG. 5A is applied to a light emitting diode. A broken line 44 shown in the figure indicates a change over time of the light output when the voltage at low level is set at 0 V (ground potential)

When the voltage at low level is set at the ground potential, the fall time is t1, whereas when the voltage at low level is set higher than the ground potential, the fall time is reduced to t2. The technique of JP-A-2003-163377 successfully reduces the fall time by continuously applying a current to the light emitting diode even during the low level to pull up the light output during the low level.

The technique of JP-A-2003-163377 is an extremely useful technique in regard to a reduction in the fall time. As long as prevailing light emitting diodes made of group III-V compounds are utilized, it can be said that this is the unique technique for reducing the fall time.

However, the technique of JP-A-2003-163377 has a problem in that a light output amplitude (difference between the light output P1 when the light emitting diode is applied with the voltage at high level and the light output P2 when applied with the voltage at low level) becomes smaller. As the light output amplitude is smaller, a special technique is needed in a receiver circuit which discriminates whether the light output is at high level or low level. A problem still remains in that a transmission distance is limited even if the special receiver circuit is utilized. The technique of JP-A-2003-163377 can be said to be an actual unique technique which can reduce the fall time by bringing the voltage at low Level to the voltage at high level, as long as the prevailing light emitting diodes made of group III-V compounds are utilized, so that the disadvantage of the reduced light output amplitude is overcome with hard efforts.

SUMMARY OF THE INVENTION

The invention provides a light source for optical communication which is capable of reducing a fall time of a light emitting diode made of a group III-V compound and still ensuring a large light output amplitude. The invention provides a completely novel light source which successfully overcomes a dilemma between the inability to reduce the fall time unless the voltage at low level is increased as long as prevailing light emitting diodes made of group III-V compounds are utilized, and a reduction in the light output amplitude resulting from an increased voltage at low level.

The light source of the invention comprises a light emitting diode comprising a group III-V compound and having a single quantum well structure. A pulse voltage applying unit which applies a pulse voltage to the light emitting diode is characterized in that the voltage at a low level is set at a voltage lower than a voltage at which a fall time of the light emitting diode is made the longest.

Prevailing light emitting diodes are mainly utilized for illumination, and have been developed with prime importance placed on higher luminance. To achieve higher luminance, prevailing light emitting diodes comprise a multi quantum well structure. The light emitting diode in the multi quantum well structure comprises a plurality of unit laminate structures, each of which has an active layer sandwiched between a pair of cladding layers. For example, a light emitting diode which has a cladding layer, an active layer, a cladding layer, an active layer, a cladding layer, an active layer, and a cladding layer laminated in this order, is called the "light emitting diode in multi quantum well structure," in which case the light emitting diode includes three quantum well structures.

The light emitting diode in multi quantum well structure has a fall time which is shorter as a voltage at low level is brought closer to a voltage at high level, so that the fall time is longer as the voltage at low level is more reduced. The fall time cannot be reduced unless the voltage at low level is increased, but an increase in the voltage at low level results in a smaller light output amplitude. This dilemma cannot be overcome as long as prevailing light emitting diodes made of group III-V compounds in multi quantum well structure are utilized.

However, the inventors found that a completely different behavior from the multi quantum well structure appears in a relationship between the voltage at low level and the fall time if a light emitting diode made of a group III-V compound in single quantum well structure is utilized.

The light emitting diode in single quantum well structure is also similar in that the fall time is reduced as the voltage at low level is brought closer to the voltage at high level, and the fall time is longer as the voltage at low level is more reduced. However, with the light emitting diode in the single quantum well structure, as the voltage at low level is further reduced, this leads to a behavior of reducing the fall time appears, on the contrary. In contrast to the conventional common sense, as the voltage at low level is reduced, a voltage region appears in which the fall time is reduced.

The invention utilizes this behavior. The fall time is longer as the voltage at low level is reduced from a value close to the voltage at high level. As the voltage at low level is still reduced in continuation, the fall time becomes shorter this time. In other words, at a certain voltage at low level, the fall time is made the longest.

In the light source of the invention, the voltage at low level is set at a voltage lower than the voltage at which the fall time of the light emitting diode is made the longest. As the fall time is reduced, making use of this region, the light output can be reduced when the voltage at low level is applied, thus producing a large light output amplitude.

With the selection of a light emitting diode made of a group III-V compound in single quantum well structure, and the voltage at low level which is set in a voltage region in which a fall time of the light emitting diode is made shorter as the voltage is reduced, it is possible to overcome the dilemma that the fall time cannot be reduced unless the voltage at low level is reduced, whereas the light output amplitude is reduced as the voltage at low level is increased. The invention can realize a light source for optical communication which achieves an extinction ratio (the ratio of the light output when the light signal is high to the light output when the light signal is low) of 10 dB or higher, and a transmission rate of 100 Mbps or higher.

It can be also said that the invention overcomes the dilemma of the fall time and light output amplitude by applying the light emitting diode made of a group III-V compound in single quantum well structure with a voltage at low level which is set at a voltage lower than a threshold voltage.

The threshold voltage used herein refers to a voltage at which a current begins to flow into the light emitting diode when a voltage is applied to the light emitting diode in the forward direction thereof. Specifically, in this invention, when the voltage at low level is applied, a lower voltage is applied as a less current flows into the light emitting diode. The application of a voltage set in this range can reduce the fall time of the light emitting diode and produce a large light output amplitude.

It can be also said that the invention overcomes the dilemma of the fall time and light output amplitude by applying the light emitting diode made of a group III-V compound in single quantum well structure with a voltage at low level lower than 40% of the voltage at high level.

The light source according to the invention can ensure a large light output amplitude as well as reduce the fall time.

DETAILED DESCRIPTION OF THE PREFERRED EMBODIMENTS

Main features of embodiments will be enumerated.

(First Aspect) A light emitting diode blinks with 10 dB or more of the ratio of the light output at high level to the light output at low level (extinction ratio). For this reason, a special receiver circuit is not required. A general-purpose receiver circuit can identify a high state and a low state of the light output.

(Second Aspect) The light emitting diode blinks at a rate which accomplishes a transmission rate of 100 Mbps or higher. Therefore, the fall time of the light output of the light emitting diode is 4.5 nsec or less.

(Third Aspect) The light emitting diode blinks to accomplish an extinction ratio of 10 dB or higher and a transmission rate of 10 Mbps or higher.

EMBODIMENTS

Figure 1:
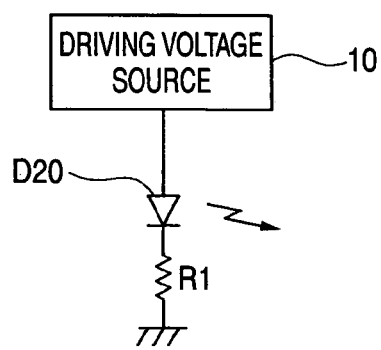
FIG. 1 shows the configuration of a light emitting diode driver in one embodiment.

As illustrated in FIG. 1, a light source of this embodiment comprises a light emitting diode D20 made of a GaN (gallium nitride) based compound in single quantum well structure (hereinafter, abbreviated as SQW), and a driving voltage source 10 for applying a pulse voltage to the light emitting diode. The driving voltage source 10 applies a rectangular pulse voltage to the light emitting diode D20 based on digital data. The light emitting diode D20 has a cathode grounded through a resistor R1. SQW means that a light emitting diode comprises only one set of unit laminate structure comprised of a pair of cladding layers and an active layer sandwiched therebetween. The SQW light emitting diode D20 of this embodiment comprises only one of the laminate structure. The light emitting diode D20 of this embodiment is not limited in the shape and the like of the cladding layers or active layers, and can utilize any type of an edge emitting type or a surface emitting type. The light output of the light emitting diode D20 is transmitted through a transmission medium such as POF, not shown, and the light output is received by a receiver circuit, not shown, and converted into an electric signal. In this way, an optical communication system over a relatively short distance (several hundreds of meters or less) is built by utilizing POF and so on.

Figure 2A:
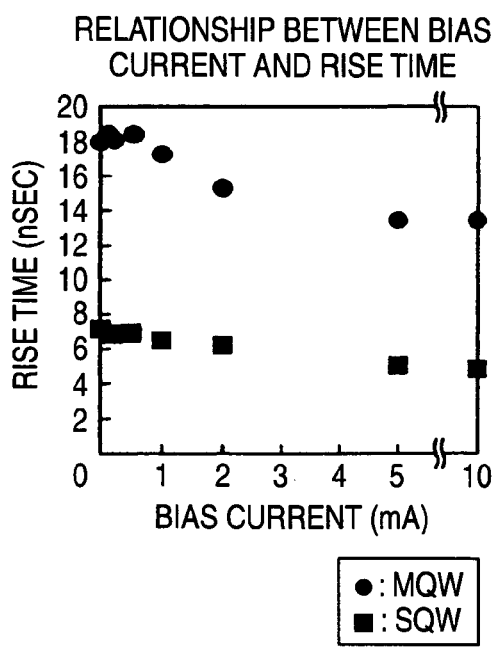
FIG. 2A shows the result of measuring a bias current and a rise time.
Figure 2B:
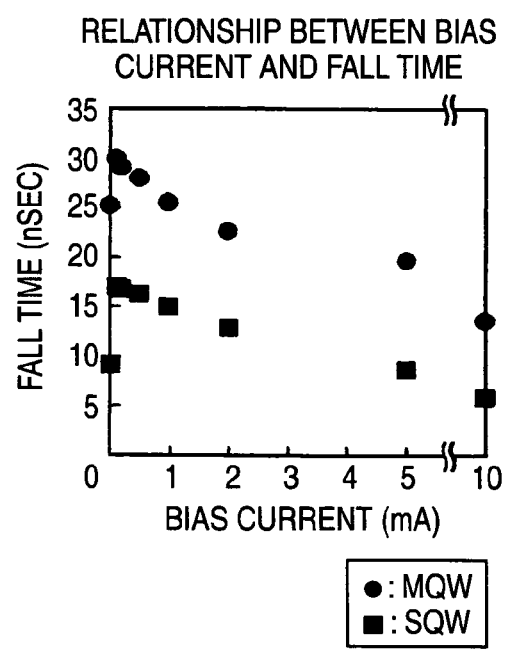
FIG. 2B shows the result of measuring the bias current and fall time.

FIG. 2A shows the results of measurements made on the magnitude of a bias current (for distinguishing a current which flows when a light signal is high, a current which is applied when the light signal is low is herein called the "bias current") applied to the light emitting diode, and a fall time at that time when an SQW diode is used, and when a light emitting diode in multi quantum well (hereinafter called the MQW) structure is used. Similarly, FIG. 2B shows the result of measuring the fall time. A current applied to the light emitting diode is 20 mA when the light signal is high.

As shown in FIG. 2, it can be seen that when the SQW light emitting diode. D20 is used, the rise time and fall time are both largely reduced, as compared with the case where the MQW light emitting diode is used. Particularly, as shown in FIG. 2B, in regard to the fall time, it can be seen that the fall time is significantly reduced as the bias current increases.

As shown in FIG. 2, it is a useful result that the rise time and fall time of the SQW light emitting diode D20 are reduced as compared with those of the MQW light emitting diode. Specifically, this result means that when a light source utilizing an SQW light emitting diode is employed in place of a related light source which utilizes an MQW light emitting diode, the rise time and fall time become shorter. However, in a technique which reduces the fall time by increasing the bias current making use of the characteristic of FIG. 2B, the difference between the light output when a light signal is high and the light output when the light signal is low, i.e., the light output amplitude is reduced because of an increased light output when the light signal is low.

However, looking to the fall time when no bias current is applied, as shown in FIG. 2B, it is found that the fall time is reduced by a similar amount to that when a bias current of several mA is applied. Thus, when detailed investigations were made on the fall time when a bias current was applied in a range in which no bias current was substantially applied (possibly, in other words, at the threshold voltage of the light emitting diode or lower), the result of measurement was found as shown in FIG. 3.

Figure 3A:
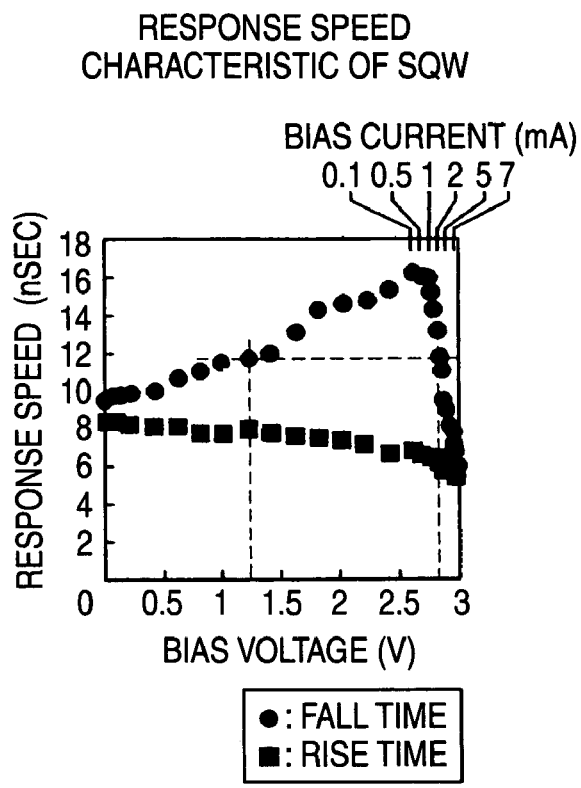
FIG. 3A shows the response speed characteristic of a single quantum well (SQW) light emitting diode.

FIG. 3A shows the result of measuring, when the SQW light emitting diode D20 was used, the magnitude of a bias voltage applied to the light emitting diode D20 when a light signal is low (for distinguishing from a voltage applied when the light signal is high, the voltage applied when the light signal is low is herein called the "bias voltage"), as well as the rise time and fall time at that time. In addition, the bias current corresponding to a bias voltage on the horizontal axis is shown together in an upper right region of the figure. This measurement result shows the result of a measurement within a range in which no bias current substantially flows, so that the bias voltage is employed on the horizontal axis. Also, FIG. 3B shows the result of a measurement on a comparative example which used an MQW light emitting diode.

As shown in FIG. 3A, as the applied bias voltage is varied, the bias voltage exists when the fall time is the longest (showing an maximum). When higher than this bias voltage, the fall time is reduced in response to an increase in the bias voltage. Likewise, when the bias voltage is smaller than that when the fall time is the longest, the fall time is reduced in response to a reduction in the bias voltage. As shown in FIG. 3A, the inventors found that, with the SQW light emitting diode D20, when it is applied with a bias voltage lower than the bias voltage when the fall time is the longest, there is a voltage region in which a behavior of reducing the fall time is seen.

Figure 3B:
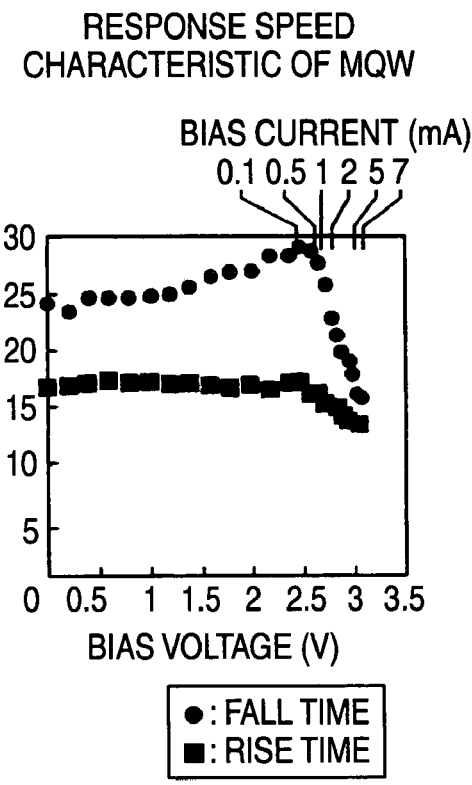
FIG. 3B shows the response speed characteristic of a multiple quantum well (MQW) light emitting diode.

As shown in FIG. 3B, with an MQW light emitting diode, in a voltage region lower than the bias voltage at which the fall time is the longest, a behavior of so clearly reducing the fall time cannot be identified as the SQW light emitting diode 20.

Figure 4:
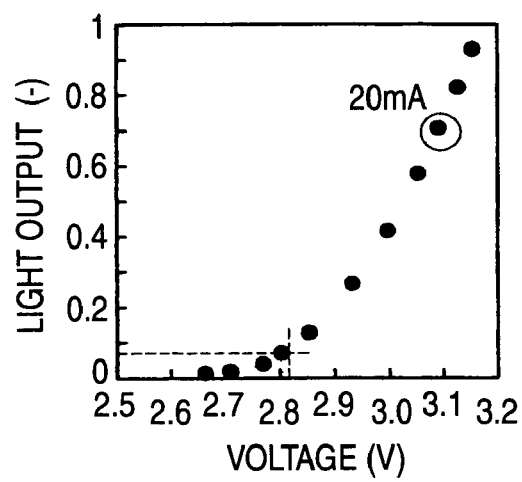
FIG. 4 shows the relationship between voltage and light output.
Figure 5A:
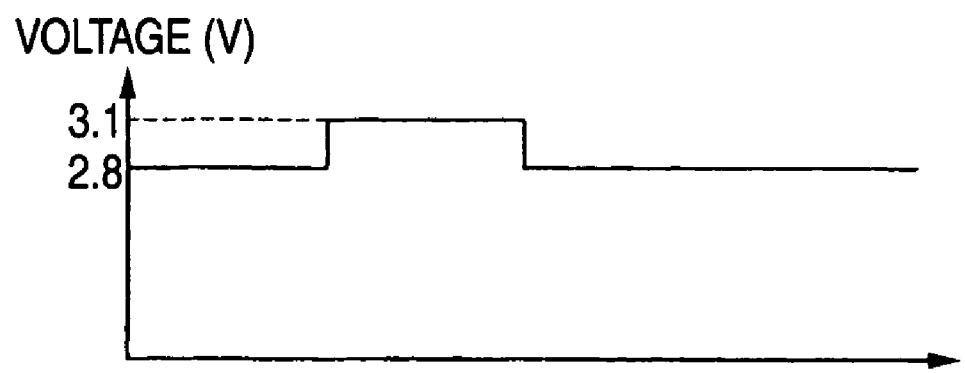
FIG. 5A shows the waveform of a pulse voltage applied to a related light emitting diode.
Figure 5B:
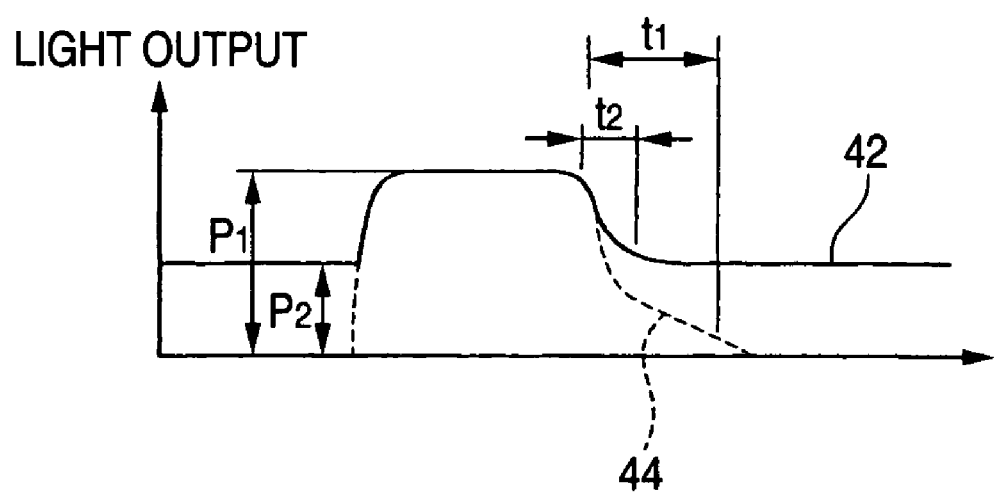
FIG. 5B shows a light output of a related light emitting diode.

For utilizing a general-purpose receiver circuit, the extinction ratio is preferably 10 dB or more. As shown in FIG. 4, in this embodiment, a current applied to the light emitting diode D20 is set to 20 mA when the light signal is high, so that the light emitting diode D20 is applied with a voltage of 3.1 V when the light signal is high. As shown in FIG. 4, for achieving the extinction ratio of 10 dB, the bias voltage must be reduced to 2.8 V or lower. As shown in FIG. 3A, the fall time is 11.84 nsec when the bias voltage is 2.8 V. In the related art, it has been thought that the fall time is reduced as the bias current is larger, so that the bias voltage was set at 2.8 V at which the extinction ratio of 10 dB is achieved. However, as shown in FIG. 3A, in regard to the SQW light emitting diode D20, it was found that a fall time equivalent to this fall time was achieved as well with a bias voltage of 1.2 V. With the bias voltage of 1.2 V, the extinction ratio can be increased to more than 10 dB. Also, when the bias voltage is reduced to lower than 1.2 V, it is possible to accomplish a yet shorter fall time and a higher extinction ratio. Considering in a relationship between the voltage (3.1 V) applied to the light emitting diode D20 when the light signal is high and the bias voltage (1.2 V) applied to the light emitting diode D20 when the light signal is low, it can be said that the bias voltage is preferably set to approximately 40% or lower (1.2/3.1×100) of the voltage applied to the light emitting diode D20 when the light signal is high.

For building optical communication systems which support recent broad bands, the transmission rate is preferably increased to 100 Mbps or higher. When an optical communication system is built using an MQW light emitting diode, the fall time is reduced by applying a bias current to the light emitting diode to realize a transmission rate of 100 Mbps or higher, whereas a difficulty arises in increasing the extinction ratio to 10 dB. Specifically, in the related art, it was impossible to simultaneously achieve the transmission rate of 100 Mbps or higher and the extinction ratio of 10 dB or higher. When the SQW light emitting diode D20 is used, and applied with a low bias voltage to generate a light signal, as is done by the light emitting diode driver of this embodiment, it is realized for the first time to built an optical communication system which simultaneously provides both of the transmission rate of 100 Mbps or higher and the extinction ratio of 10 dB or higher.

While specific examples of the invention have been described in detail, they are merely illustrative, and do not limit claims. Techniques described in claims include a variety of alternations and modifications made on the specific examples illustrated above.

Also, the technical elements described in the specification and drawings exert technical utility separately or in combination, and are not limited to a combination of claims at the filing time. Also, the techniques illustrated in the specification and drawings can simultaneously achieve a plurality of objects, and have technical utility by achieving one of these objects per se.

What is claimed is:

1. A light source comprising:
   a light emitting diode comprising a group III-V compound and having a single quantum well structure; and
   a pulse voltage applying unit which applies a pulse voltage to the light emitting diode,
   wherein a voltage at a low level of the pulse voltage is set to a voltage lower than a voltage at which a fall time of the light emitting diode is made the longest.

2. The light source according to claim 1, wherein the pulse voltage applying unit applies a rectangular pulse voltage to the light emitting diode based on digital data.

3. The light source according to claim 1, wherein the group III-V compound comprises GaN.

4. The light source according to claim 1, wherein the voltage at the low level of the pulse voltage is set to a voltage lower than 40% of a voltage at a high level of the pulse voltage.

5. The light source according to claim 1, wherein said voltage at which a fall time of the light emitting diode is made the longest comprises 2.8 V.

6. The light source according to claim 1, wherein said voltage at which a fall time of the light emitting diode is made the longest comprises 1.2 V.

7. The light source according to claim 1, wherein said light emitting diode comprises a single active layer.

8. The light source according to claim 7, wherein said light emitting diode comprises a pair of cladding layers, said single active layer being formed between said pair of cladding layers.

9. The light source according to claim 1, further comprising:
    a resistive element said light emitting diode comprising a cathode that is grounded through said resistive element.

10. An optical communication system, comprising:
    a light source comprising:
        a light emitting diode comprising a group III-V compound and having a single quantum well structure; and
        a pulse voltage applying unit which applies a pulse voltage to the light emitting diode, a voltage at a low level of the pulse voltage being set to a voltage lower than a voltage at which a fall time of the light emitting diode is made the longest;
    a light transmission medium coupled to said light source for transmitting light emitted from said light source; and
    a receiver circuit coupled to said light transmission medium for receiving said light transmitted by said light transmission medium and generating an electric signal.

11. The optical communication system of claim 10, wherein said light source comprises an extinction ratio of at least 10 dB and a transmission rate of at least 100 Mbps.

12. The optical communication system of claim 10, wherein said light transmission medium comprises plastic optical fiber.

13. The optical communication system of claim 10, wherein said voltage at which a fall time of the light emitting diode is made the longest comprises a predetermined voltage.

14. The optical communication system of claim 13, wherein said pulse voltage comprises a high level voltage, said predetermined voltage being based an said high level voltage of the pulse voltage.

* * * * *